(12) United States Patent
Drapkin et al.

(10) Patent No.: US 7,295,828 B2
(45) Date of Patent: Nov. 13, 2007

(54) DIFFERENTIAL SIGNAL COMPARATOR

(75) Inventors: Oleg Drapkin, Richmond Hill (CA);
Grigori Temkine, Markham (CA)

(73) Assignee: ATI Technologies Inc., Markham, Ontario (CA)

( * ) Notice: Subject to any disclaimer, the term of this patent is extended or adjusted under 35 U.S.C. 154(b) by 695 days.

(21) Appl. No.: 10/858,442

(22) Filed: Jun. 1, 2004

(65) Prior Publication Data
US 2005/0266810 A1    Dec. 1, 2005

(51) Int. Cl.
*H04B 1/16*    (2006.01)
(52) U.S. Cl. ............... 455/343.2; 455/574; 375/340
(58) Field of Classification Search ............ 455/343.1, 455/343.2, 343.3, 343.4, 574; 375/340, 346
See application file for complete search history.

(56) References Cited

U.S. PATENT DOCUMENTS

| | | | | |
|---|---|---|---|---|
| 5,600,899 A | * | 2/1997 | Stevens et al. | ............ 34/487 |
| 6,100,814 A | * | 8/2000 | Doyle | ............ 340/825.69 |
| 6,560,240 B1 | | 5/2003 | Borland et al. | |
| 6,574,482 B1 | * | 6/2003 | Radomsky et al. | ......... 455/517 |
| 6,831,953 B2 | * | 12/2004 | Porcino | ............ 375/261 |
| 6,904,102 B2 | * | 6/2005 | Porcino | ............ 375/316 |
| 2005/0135290 A1 | * | 6/2005 | Kluge et al. | ............ 370/315 |

OTHER PUBLICATIONS

Bhatt, Ajay V.; Creating a Third Generation I/O Interconnect; Desktop Architecture Labs, Intel Corporation; from www.expresslane.org; pp. 1-11.
"Co-pending U.S. Appl. No. 10/893,641, filed Jul. 16, 2004, Caruk, et al."

* cited by examiner

*Primary Examiner*—Edward F. Urban
*Assistant Examiner*—Blane J. Jackson
(74) *Attorney, Agent, or Firm*—Vedder, Price, Kaufman & Kammholz, P.C.

(57) ABSTRACT

A differential signal comparator includes an input circuit operative to provide an absolute input current difference value that is associated with the absolute difference of differential input signal levels, and a reference circuit operative to provide an absolute reference current difference value that is associated with the absolute difference of the reference signal levels. Current comparison of the absolute input current difference value with the absolute reference current difference value identify whether an input differential signal is bigger than the reference noise level and should be processed, or an input differential signal is smaller than the reference noise level and should not be processed.

15 Claims, 4 Drawing Sheets

DIFFERENTIAL SIGNAL COMPARATOR

FIELD OF THE INVENTION

The present invention relates generally to detecting an incoming electrical communication signals and more specifically to separating electrical noise from the incoming electrical communication signals.

BACKGROUND OF THE INVENTION

In a typical computing system, when processing devices are in communication across a bus with differential signals, problems may arise due to noise on the bus. If a particular processing device is in a sleep mode or commonly referred to as an idle mode, or otherwise not expecting an incoming signal, the noise on the bus may be misinterpreted, thereby causing unnecessary computations in a processing device. This not only potentially reduces battery life by increased power consumption for improper and unwarranted computations, but can also cause the processing device to improperly attempt to interpret the noise as an incoming data signal. Currently, there exist techniques to separate differential noise level from differential signal levels to determine if the incoming signal is a valid differential signal. A common approach is to provide functionality using 4 differential stages with sequential logic to differentiate noise from signal information.

More specifically, 4 differential stages may utilize 2 differential voltage comparators with the window, using a well known schematic, to compare differential signal levels provided across a bus with reference to two reference voltages. These two differential comparators with the window can identify whether incoming differential signal level is higher than high noise level and lower than low noise level. In this approach, a logical device is needed to determine if an input signal is higher than a first reference voltage or lower than a second reference voltage. These 4 differential stages (two differential comparators with window) not only require significant amount of the chip area, but also require large amounts of power consumption.

Therefore, there exists a need for a new solution that allows for the determination of an incoming differential signal either to be processed as an incoming data signal or be ignored as noise, wherein the incoming signal detection device consumes small chip area and also reduces the amount of chip power consumption.

DETAILED DESCRIPTION OF THE PREFERRED EMBODIMENTS

Briefly, a differential signal comparator includes an input circuit operative to calculate an input absolute value of the difference between a first current and a second current. The input circuit is operative to receive a differential input signal, such as Vdiff.inp., representing an incoming differential signal from across a bus or any other suitable incoming means. The input circuit generates the first current and second current value proportional to the differential signal levels, and calculates the absolute value of the difference between the first current and the second current.

The apparatus for differential signal comparison further includes a reference circuit operative to generate the first reference current and the second reference current values to calculate an absolute difference between a first reference current and a second reference current. In one embodiment, the reference circuit is similar to the input circuit, wherein the reference circuit receives a differential reference voltage, Vdiff.ref. The reference circuit generates the absolute value of the difference between the first reference current and the second reference current.

The differential signal comparator evaluates the absolute difference of the differential inputs value and the absolute difference of the differential references value such that if the input absolute value is greater than the reference absolute value, an incoming signal can be processed as an incoming communication signal. In one embodiment, the comparator may be a simple hard-wire connection, such as a node, to transfer the difference between the current equivalent of the absolute input difference and the current equivalent of the absolute reference difference into logical level. In one embodiment, based on the connections, the greater current from the voltage supply will be accessible at the node in case of having a differential signals level greater than a differential reference level, thereby providing the determination of the incoming signal as being a communication signal, or the greater current will flow to ground in case of having a differential signals level smaller than a differential reference level, thereby providing the determination of the incoming signal as being noise.

Figure 1:
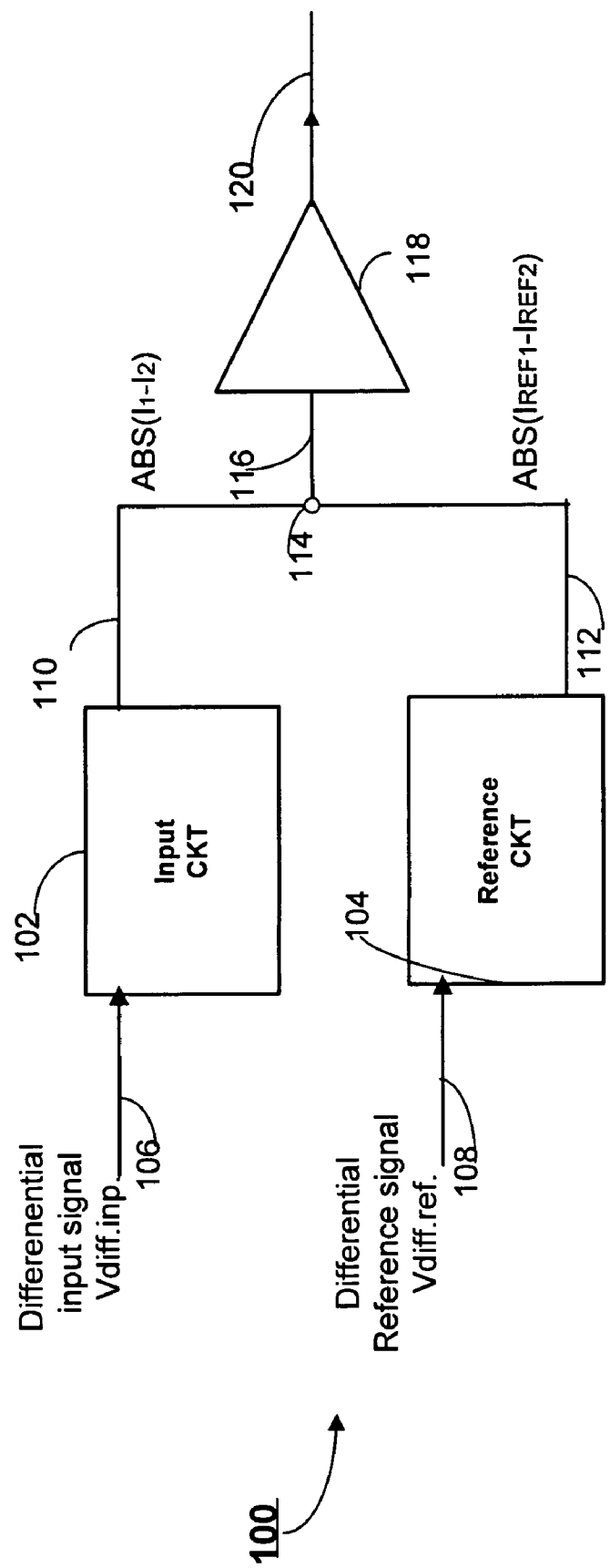
FIG. 1 illustrates a schematic block diagram of an apparatus for differential signal comparison in accordance with one embodiment of the present invention.

More specifically, FIG. 1 illustrates a differential signal comparator 100 including an input circuit 102 and a reference circuit 104. The input circuit 102 and the reference circuit 104 provide absolute difference calculations based on current mirrors application, as discussed in further detail below in FIG. 2. The input circuit 102 is operative to receive a differential input signal 106 (Vdiff.inp.). Typically, the input signal 106 is received across a bus or any other communication devices in connection with a processing device. In one embodiment, the apparatus 100 may be disposed on a processing device in communication with another processing device across a bus, wherein the processing device hosting the differential signal comparator 100 is operative to inform about an idle mode based on lack of processing activity and inform about an active mode during normal operations.

The reference circuit 104 is further operative to receive a differential reference signal 108 (Vdiff.ref.). In one embodiment of the present invention (FIG. 2.), the input circuit 102 is operative to generate an output signal 110 having a current equivalent to the absolute value of the difference between a first current and the second current. These currents are proportional to the levels of differential input signals. The first current and the second current are generated by the input circuit 102 in response to the differential input signal Vdiff.inp. 106, as described in further detail below with regards to FIG. 2.

Similarly, the reference circuit 104 generates signal 112 as a current equivalent of the absolute value of the difference between a first reference current and a second reference current as generated from the reference signal Vdiff.ref. 108 FIG. 1.

A current comparator 114 is operative to receive both signals 110 and 112. Based on inherent properties of current flow, the signal, either 110 or 112 having a greater current will pass across the node 114 and be the output signal 116. In one embodiment, the output signal 116 may be provided to a buffer 118 to generate a processing device input signal 120, wherein the processing device input signal 120 may be utilized to determine if the differential input signal 106 received from across a bus is an incoming data signal or noise. More specifically, if the output signal 110 has a current value below the reference current value 112, this is indicative of the input signal 106 Vdiff.inp. represents noise across the bus and to be ignored by a subsequent processing device (in this case output signal 116 level is low), furthermore if the output signal 110 has a current value greater than the reference current value, this is indicative of the input signal 106 is an incoming data signal and should not be ignored (in this case output signal 116 level is high). It is within the present invention to include further processing elements within the comparator 114.

Figure 2:
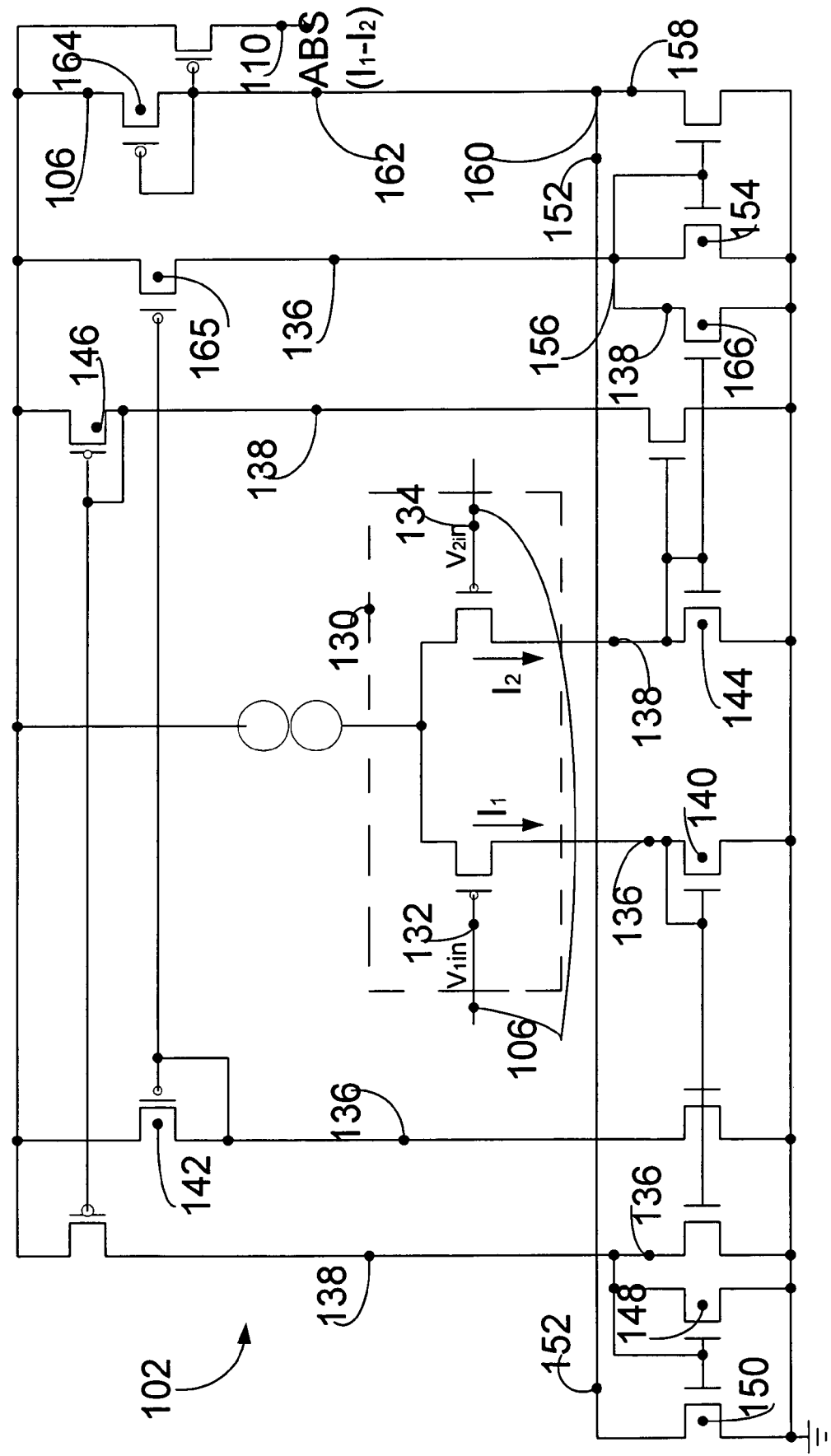
FIG. 2 illustrates a graphical representation of one embodiment of a circuit diagram for differential signal comparison in accordance with one embodiment of the present invention.

FIG. 2 illustrates a graphical representation of one embodiment of the circuit diagram of the input circuit 102. The input circuit 102 receives the differential input signal Vdiff.inp. 106 (V1in. and V2in.) at the input of a voltage to current converter 130. As such, the voltage to current converter 130 generates a first current I1 (136) and a second current I2 (138) proportional to differential input signal levels V1in. and V2in. Current I1 (136) is supplied to transistor 140 that reflected the first current 136 with the help of transistor 142.

The second current I2 (138) is provided to a third transistor 144, that reflected the second current 138 with the help of the forth transistor 146. Further using a current mirror schematic the second current 138 is provided to the drain of the fifth transistor 148. The gate of the fifth transistor 148 in connection to the gate of transistor 150. That is how a first current difference 152 is generated. The current 152 is the difference between the second current I2 138 and the first current I1 136.

Further using a current mirror based on transistors 142 and 165, the first current 136 is provided to the drain of transistor 154. The node 156 further receives the second current I2 138 from a current mirror based on transistors 144 and 166. Thereupon, the node 156 provides a second current difference signal 158 based on the difference between the first current I1 136 and the second current I2 138. Therein at node 160, based on the current flow rules, the absolute value of the current differences between the first current 136 and the second current 138 is provided (162) to the current mirror 164. The current mirror 164 generates the output signal 110 that is the absolute value of the first current 136 minus the second current 138.

FIG. 2 illustrates a representative embodiment of an input circuit 102 for generating the current 110 that is proportional to the absolute difference of differential input signal 106. As recognized by one having ordinary skill in the art, the circuit 102 of FIG. 2 may further represent one embodiment of the reference circuit 104, wherein the input voltage previously noted in FIG. 2 as Vdiff.inp. 106 would be the differential reference signal Vdiff.ref. 108 and including voltage inputs of V1ref and V2ref. Using the same approach as noted above with regards to FIG. 2, the reference absolute value signal 112 is generated with the same technique. The only difference is that the reference circuit 104 should be implemented either with complimentary transistors, or should have a complimentary output stage to provide the current to be subtracted from the output current 110.

Figure 3:
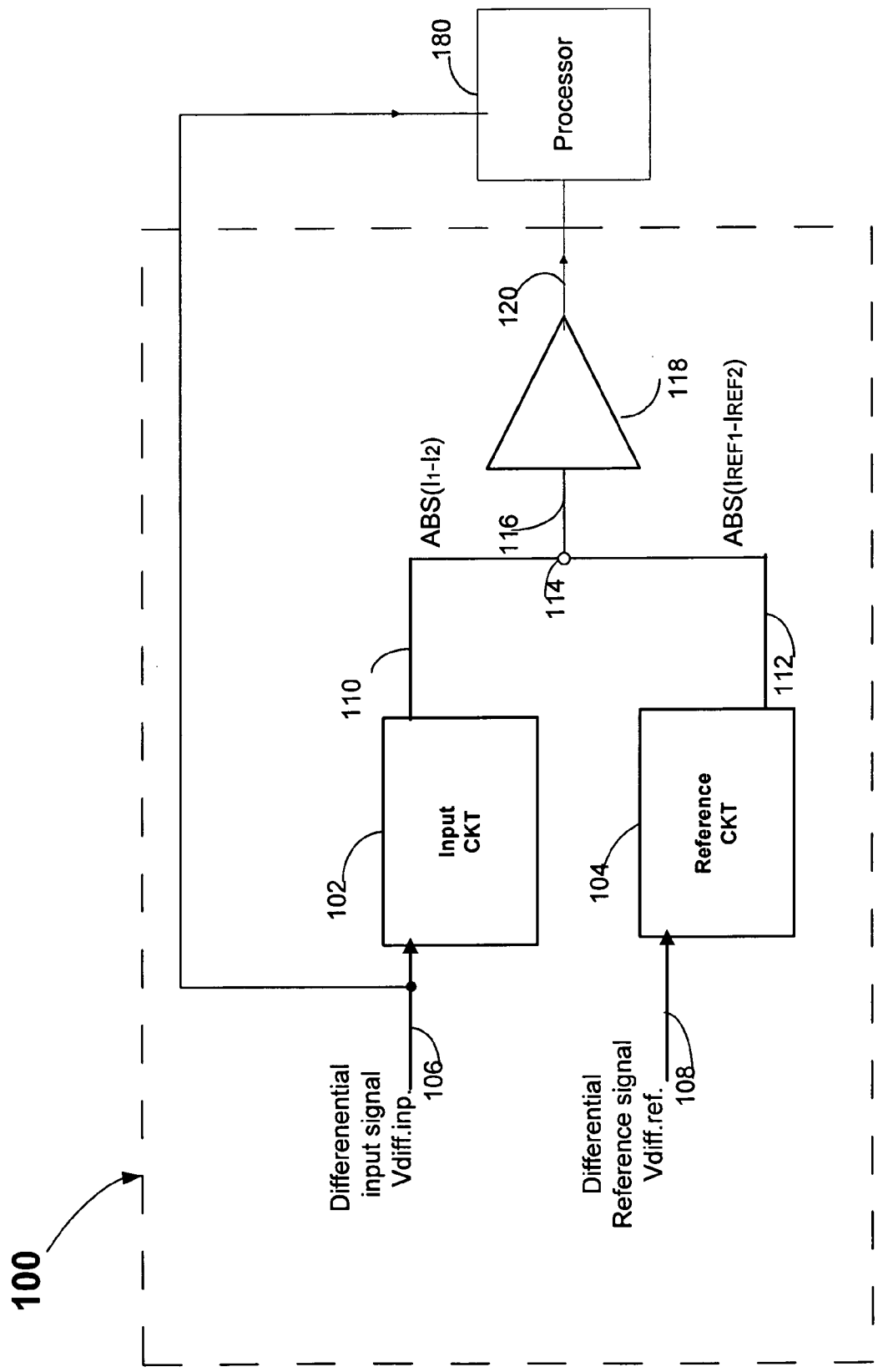
FIG. 3 illustrates another schematic block diagram of an apparatus for a differential signal for comparison in accordance with another embodiment of the present invention.

FIG. 3 illustrates a further embodiment of the present invention, including the apparatus 100 coupled to a data processor 180. The processor 180 may be any suitable type of processing element, such as an application specific integrated circuit, a plurality of processors, a DSP, microprocessor, or any other implementation capable of processing data and executing software or discrete logic or any suitable combination of hardware, software and/or firmware. The term processor should not be construed to refer exclusively to hardware capable of executing software and may be implicitly include DSP hardware, ROM for storing software, RAM, and any other volatile or non-volatile storage medium.

In one embodiment of the present invention, the processor 180 is operative to receive the signal 120 from the device 100, as well as incoming differential signal. The device 100 includes the elements as noted above with respect to FIG. 1. Based on the receipt to the signal 120, the processor 180 is operative to process the input signal 106 or ignore it based on the level of signal 120. If the processor 180 is operating in an idle mode and an incoming signal 106 is a valid signal, the processor 180 then performs wake-up operations to resume power consumption. Furthermore, in the event the processor 180 receives the incoming signal 106 that is below the threshold level determined by the signal 120 as in noise case, the processor 180 would maintain its idle state.

Figure 4:
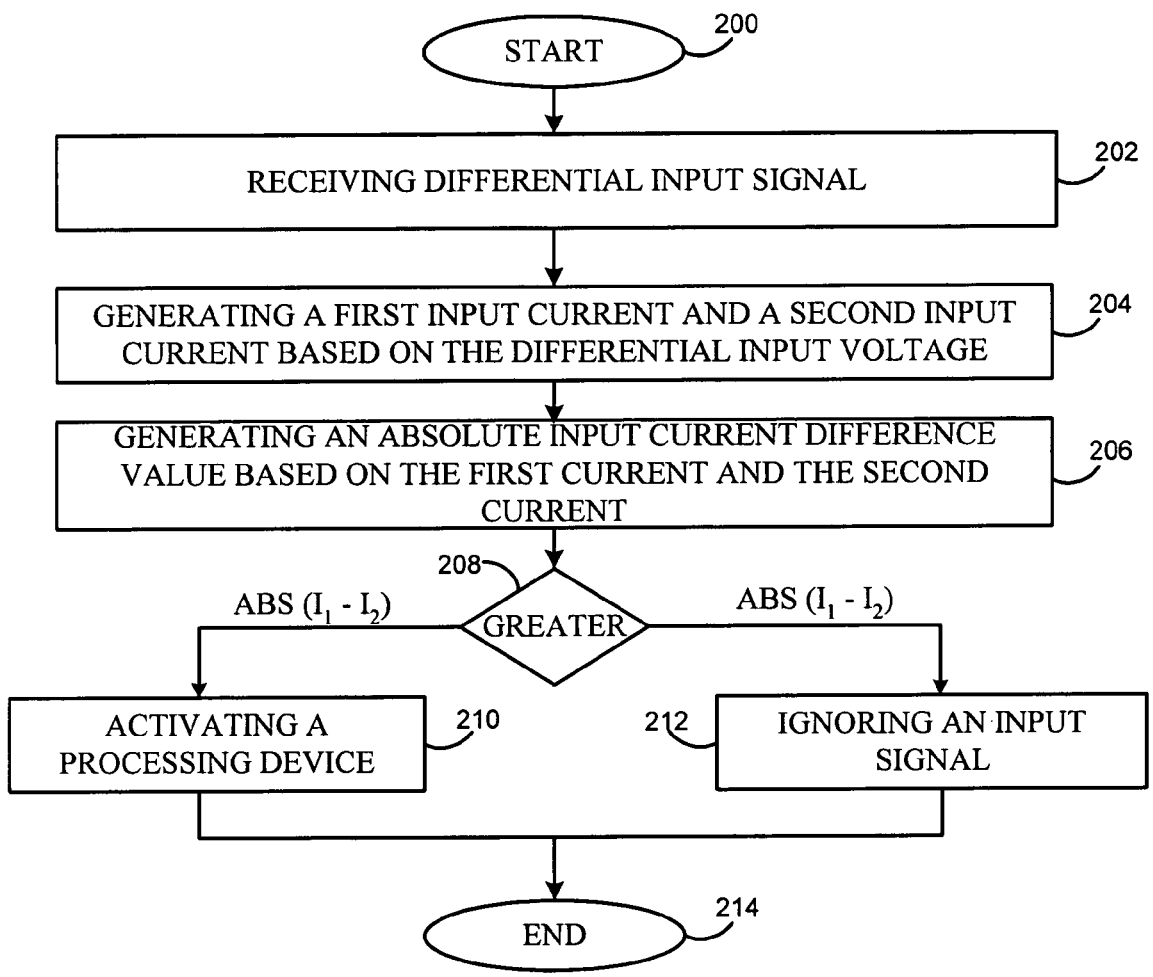
FIG. 4 illustrates a flowchart of the steps of a method for differential signal comparison, in accordance with one embodiment of the present invention.

FIG. 4 illustrates a flowchart of one embodiment of a method for differential signal comparison, in accordance with one embodiment of the present invention. The method begins, step 200, by receiving a differential input signal, step 202. In one embodiment, the differential input signal may be the input signal 106 from FIGS. 1 and 3 having an input voltage (Vdiff.inp.), or signals V1in (132) and V2in (134) from FIG. 2. Next, step 204, is generating a first input current and a second input current based on the differential input signal levels. In one embodiment, the first current 136 and the second current 138 of FIG. 2 may be generated using the voltage to current converter 130.

Step 206 is generating an absolute input current difference value based on a first current and a second current. The absolute input current difference value, such as signal 110 of FIG. 1 may be generated using the input circuit 102 illustrated in detail in FIG. 2. The next step, step 208, is comparing the absolute input current difference value with an absolute reference current difference value. The steps may be performed as noted in FIG. 1 by the node 114 receiving signals 110 and 112, signal 112 can be generated with the same sequence of steps utilized to generate signal 110. For example, generating the absolute value reference signal may include: receiving the differential reference signal; generating a first reference current and the second reference current based on differential reference voltage levels; and generating an absolute difference current value based on the first reference current and the second reference current.

If the absolute input current difference value is greater than the absolute reference current difference value, the method proceeds to step 210 which is activating a processing device. The processing device, such as processing device 180 of FIG. 3, may be activated based on the understanding that the incoming signal is a data signal. Although, if the absolute input current difference value is less than the absolute reference current difference value, the method proceeds to step 212 which is ignoring the input signal. In step 212, the input signal is ignored as it is deemed to be either noise or any other extraneous voltage coming across a data bus. Regardless thereof, whether the method proceeds to step 210 or 212, in one embodiment to the present invention, the method is complete, step 214.

The present invention provides differential signal versus noise identification with low power consumption solution based on utilizing the input circuit 102 and the reference circuit 104 that provides absolute difference calculations based on current mirror circuits applications. The present invention further provides for a significant reduction in size required for determining if an incoming signal is data or noise. The input circuit 102 and reference circuit 104 requires a significantly reduced amount of chip area in a computer processing environment to perform the operation of determining whether the incoming signal is greater than or less than a reference noise signal levels. The present invention also utilizes less processing resources, thereby allowing further power saving advantages over the prior techniques.

It should be understood that the implementation of other variations and modifications of the invention in its various aspects will be apparent to those of ordinary skill in the art, and that the invention is not limited to the specific embodiments described herein. For example, the input circuit 102 and reference circuit 104 contain any other implementations allowing for the manipulation of currents with reference to voltages within the system such that the absolute value of the difference between various current signals is generated. It is therefore contemplated to cover by the present invention, any and all modifications, variations or equivalents that fall within the spirit and scope of the basic underlying principals disclosed and claimed herein.

What is claimed is:

1. An apparatus for differential signal communications, the apparatus comprising:
    an input circuit operative to receive a first input voltage and a second input voltage of differential input signal, the input circuit operative to generate an input absolute value of the difference between a first current associated with the first input voltage and a second current associated with the second input voltage;
    a reference circuit operative to generate a reference absolute value of the difference between a first reference current associated with a first reference voltage and a second reference current associated with a second reference voltage; and
    a current comparator operative to compare the input absolute value and the reference absolute value such that if the input absolute value is greater than the reference absolute value, an incoming signal is determined to be an incoming communication signal and if the input absolute value is smaller than the reference absolute value, the incoming signal is determined to be an incoming noise signal.

2. The apparatus of claim 1 wherein the first current is proportional to the absolute difference of the input differential signal levels.

3. The apparatus of claim 1 wherein the second current is proportional to the absolute difference of the reference differential signal levels.

4. The apparatus of claim 1 wherein the input circuit provides differential signals absolute difference calculations using a plurality of current mirror.

5. The apparatus of claim 1 wherein input circuit includes a differential input voltage to current converter and the reference circuit includes a differential reference voltage to current converter such that the differential input voltage to current converter is operative to provide a current that is related to the absolute input signal difference, and the differential reference voltage to current converter is operative to provide a complimentary current that is related to the absolute reference signal difference to the current comparator.

6. The apparatus of claim 1 further comprising:
    a processing device operably coupled to the differential input signal and to the differential signal comparator such that the processing device is operative to generate a wake-up command if the incoming signal is determined to be an incoming communication signal.

7. An apparatus for differential signal communications, the apparatus comprising:
    an input circuit operative to receive a first input voltage and the second input voltage of differential input signal, the input circuit operative to generate an input absolute value of the difference between a first current associated with the first input voltage and a second current associated with the second input voltage;
    a reference circuit operative to generate a reference absolute value of the difference between a first reference current associated with a first reference voltage and a second reference current associated with a second reference voltage;
    a comparator operative to compare the input absolute value and the reference absolute value such that if the input absolute value is greater than the reference absolute value, an incoming signal is determined to be an incoming communication signal and if the input absolute value is smaller than the reference absolute value, an incoming signal is determined to be an incoming noise signal; and
    a processing device operative to generate a wake-up command and start processing data if the incoming signal is determined to be the incoming communication signal or to generate an idle signal and stop processing data if the incoming signal is determined to be the incoming noise.

8. The apparatus of claim 7 wherein the first current is proportional to the absolute difference of the input differential signal levels.

9. The apparatus of claim 7 wherein the second current is proportional to the absolute difference of the reference differential signal levels.

10. The apparatus of claim 7 wherein the input circuit provides differential signals absolute difference calculations based on current mirrors application.

11. The apparatus of claim 7 wherein input circuit includes a differential input voltage to current converter and the reference circuit includes a differential reference voltage to current converter such that the differential input voltage to current converter is operative to provide a current that is related to the absolute input signal difference, and the differential reference voltage to current converter is operative to provide a complimentary current that is related to the absolute reference signal difference to the current comparator.

12. A method for different signal comparison, the method comprising:
- receiving a differential input signal;
- generating a first current associated with the first input voltage level and the second current associated with the second input voltage level;
- generating an absolute input current difference value based on the first current and the second current;
- receiving a differential reference signal;
- generating a first reference current associated with the first reference voltage level and the second reference current associated with the second reference voltage level;
- generating an absolute reference current difference value based on the first reference current and the second reference current;
- comparing the absolute input current difference value with the absolute reference current difference value; and
- if the absolute input current difference value is greater than the absolute reference current difference value, activating a processing device to start processing data.

13. The method of claim 12 further comprising:
- if the absolute input current difference value is smaller than the absolute reference current difference value, ignoring the input signal as noise to stop processing data.

14. The method of claim 12 wherein the absolute difference of the input current value is proportional to the absolute difference of the input differential signal levels.

15. The apparatus of claim 12 wherein the absolute difference of the reference current value is proportional to the absolute difference of the reference differential signal levels.

* * * * *